(12) United States Patent
Liu et al.

(10) Patent No.: US 9,613,865 B2
(45) Date of Patent: Apr. 4, 2017

(54) SEMICONDUCTOR DIE AND DIE CUTTING METHOD

(71) Applicant: Semiconductor Manufacturing International (Shanghai) Corporation, Shanghai (CN)

(72) Inventors: Jyishyang Liu, Shanghai (CN); Xuanjie Liu, Shanghai (CN); Xiaojun Chen, Shanghai (CN); Lushan Jiang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/990,830

(22) Filed: Jan. 8, 2016

(65) Prior Publication Data

US 2016/0204071 A1    Jul. 14, 2016

(30) Foreign Application Priority Data

Jan. 9, 2015   (CN) .......................... 2015 1 0011960

(51) Int. Cl.
*H01L 21/78*   (2006.01)
*H01L 21/66*   (2006.01)

(52) U.S. Cl.
CPC .............. *H01L 21/78* (2013.01); *H01L 22/34* (2013.01); *H01L 2924/0002* (2013.01)

(58) Field of Classification Search
CPC   H01L 23/544; H01L 21/78; H01L 2223/5446
See application file for complete search history.

(56) References Cited

U.S. PATENT DOCUMENTS

2002/0043700 A1* 4/2002 Sasaki ................. H01L 21/3212
                                                              257/620

* cited by examiner

*Primary Examiner* — Roy Potter
*Assistant Examiner* — Paul Patton
(74) *Attorney, Agent, or Firm* — Anova Law Group, PLLC (57) ABSTRACT

The present disclosure provides die cutting methods and semiconductor dies. A semiconductor substrate has a test region, isolation regions, and core regions. A device layer, an interconnection layer, and a soldering pad layer are formed on the semiconductor substrate. The soldering layer includes a plurality of soldering pads. A passivation layer covers the soldering pads and the interconnect layer, and is etched to form trenches on the soldering pads above the core regions and the test region. The passivation layer, the interconnect layer, and the device layer are etched to form isolation trenches at junctions of the isolation region and the test region, disconnecting the passivation layer, the interconnect layer and the device layer. A cutting process is performed along the test region, each of the semiconductor substrate, the device layer, the interconnect layer and the soldering pad layer is cut in two.

20 Claims, 5 Drawing Sheets

SEMICONDUCTOR DIE AND DIE CUTTING METHOD

CROSS-REFERENCES TO RELATED APPLICATIONS

This application claims the priority of Chinese patent application No. CN201510011960.2, filed on Jan. 9, 2015, the entire content of which is incorporated herein by reference.

FIELD OF THE DISCLOSURE

The present disclosure relates to the field of semiconductor technology and, more particularly, relates to a die cutting method and related semiconductor die.

BACKGROUND

Die cutting has always been a very important process in the semiconductor industry. After subjecting to complex fabrication processes, a semiconductor wafer needs to be split into a plurality of small dies or chips by a die cutting process. During the die cutting process, it is desirable not to destroy chip functions and to provide a high production yield. In addition, a too-slow cutting rate may increase cost in the semiconductor chip manufacturing process.

Conventionally cutting blades are used to mechanically cut a semiconductor wafer into separate chips. However such cutting process may apply a large mechanical stress to the wafer. In addition, chips usually have a multilayer structure and stress may be present between various material layers. When subjected to mechanical cutting, the interlayer stress may be released to cause the de-lamination and/or cracking between the material layers along the scribe line between the chips. Further, in the conventional semiconductor chip manufacturing process, a low K dielectric material is typically used for the interlayer dielectric layers to reduce the RC delay of the chip operation. But the low K dielectric material itself is a low density, fragile material. During the blade cutting process, the cutting stress is likely to break the low K dielectric material layers. These issues may reduce the production yield of the cut chips.

Alternatively and conventionally, prior to the blade cutting, a laser cutting process may be performed to pre-cut the wafer to disconnect the material layers between individual chips. Then the blade cutting is performed to completely separate the chips. Compared to the direct blade cutting, using laser cutting to pre-cut the wafer reduces the problems of de-lamination and cracking to certain degree. Nevertheless, due to the intense energy of the laser cutting, the above issues cannot be completely eliminated. Moreover, the high cost of laser cutting does not help reduce the chip manufacturing cost.

It is desirable to improve production yield of dies based on the blade cutting process.

BRIEF SUMMARY OF THE DISCLOSURE

One aspect of the present disclosure provides a die cutting method. A semiconductor substrate has a test region, isolation regions on both sides of the test region, and core regions outside of the isolation regions. A device layer, an interconnection layer located on the device layer, and a soldering pad layer on the interconnection layer are formed on the semiconductor substrate. The soldering layer includes a plurality of soldering pads formed over the test regions, the isolation regions and the core regions. A passivation layer covers the soldering pads and the interconnect layer. The passivation layer is etched to form trenches to expose the soldering pads located above the core regions and the test region. The passivation layer, the interconnect layer, and the device layer are etched to expose a surface of the semiconductor substrate to form isolation trenches at junctions of the isolation region and the test region, disconnecting the passivation layer, the interconnect layer and the device layer. A cutting process is performed along the test region between the adjacent isolation trenches, each of the semiconductor substrate, the device layer, the interconnect layer and the soldering pad layer is cut in two.

Another aspect of the present disclosure provides a semiconductor die. The semiconductor die includes a semiconductor structure including a cut semiconductor substrate having a cut test region, a core region and an isolation region configure between the cut test region and the core region. A cut device layer is on the cut semiconductor substrate. A cut interconnection layer is on the cut device layer. A cut soldering pad layer is on the cut interconnection layer. Such semiconductor structure is formed by the disclosed methods.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

In one embodiment, isolation trenches may be formed located above the junctions of the isolation regions and the test region to disconnect the passivation layer, the interconnect layer and the device layer. Then die cutting may be performed along the test region located between the adjacent isolation trenches to separate the semiconductor substrate, the device layer, the interconnect layer and the soldering pad layer from each other on both sides of the test region. Prior to the die cutting, the passivation layer, the interconnect layer and the device layer may be disconnected by the isolation trenches. Thus, the stress resulted from the die cutting process may not be transferred to the passivation layer, the interconnect layer and the device layer both sides of the test region and the de-lamination and cracking of the material layers may be avoided.

Figure 7:
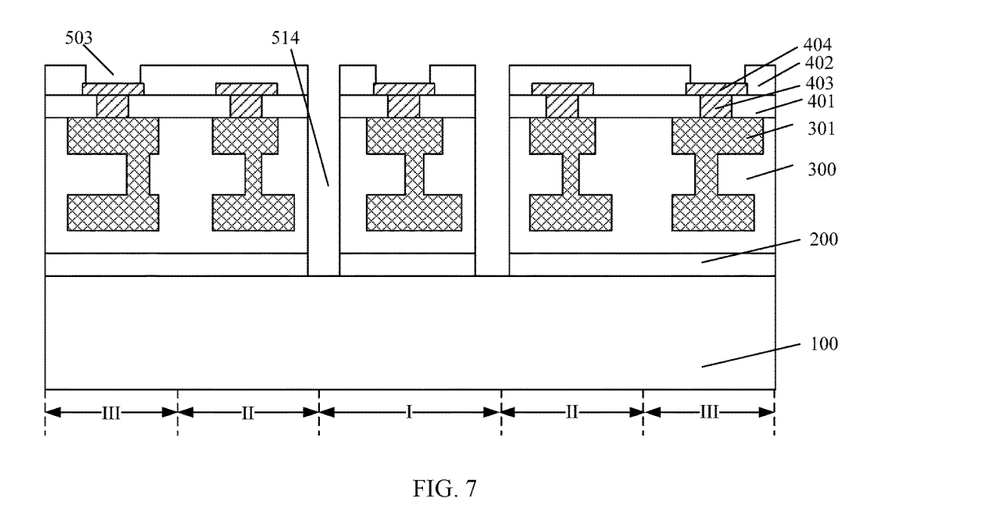
Figure 8:
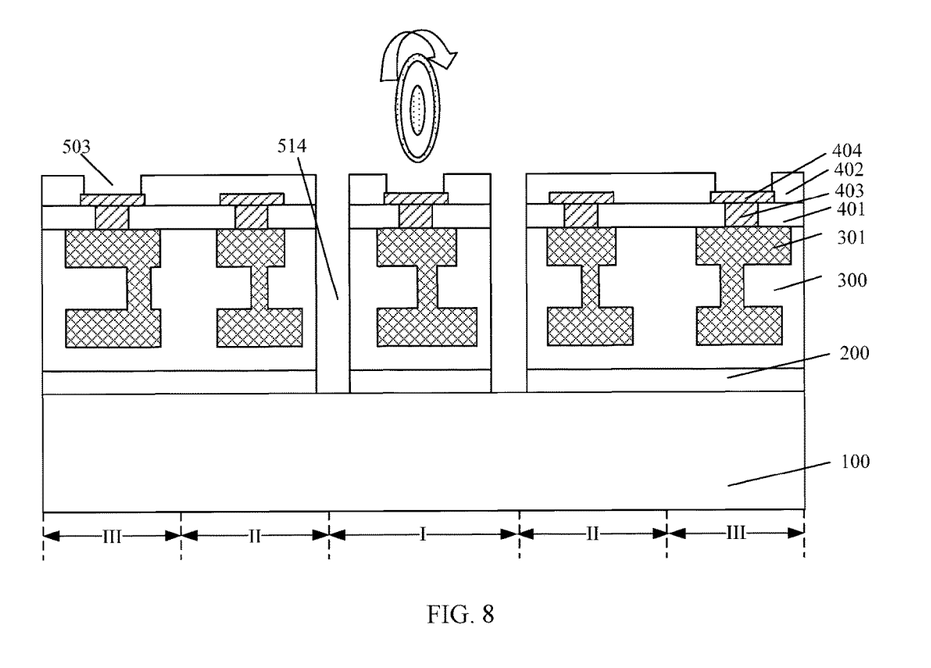
Figure 9:
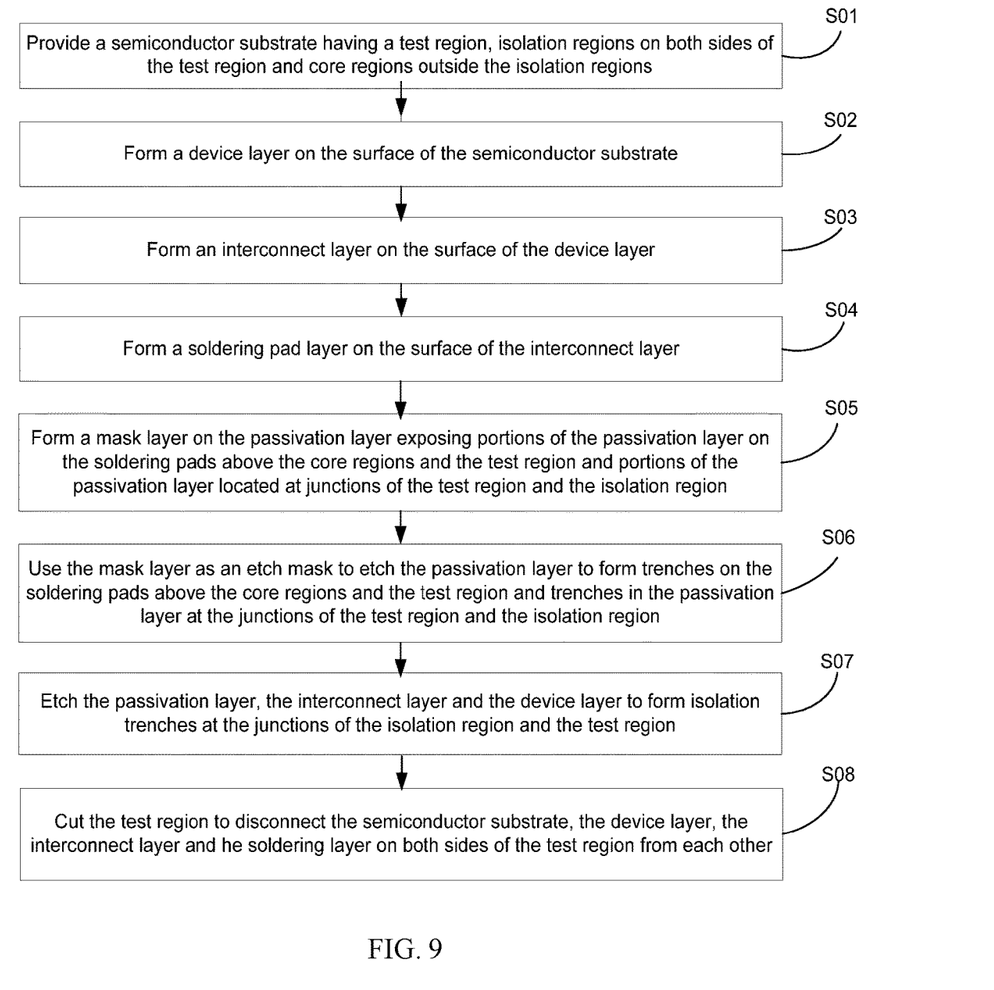
FIG. 9 illustrates a flow chart of an exemplary method for fabricating a semiconductor structure consistent with various disclosed embodiments.

FIGS. 1-8 illustrate cross sectional structures of an exemplary semiconductor structure corresponding to certain stages of a fabrication process consistent with various disclosed embodiments. FIG. 9 illustrates a flow chart of an exemplary method for fabricating a semiconductor structure consistent with various disclosed embodiments.

Figure 1:
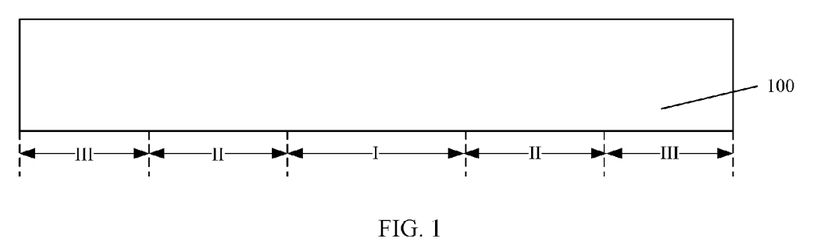
FIGS. 1-8 illustrate cross sectional structures of an exemplary semiconductor structure corresponding to certain stages of a fabrication process consistent with various disclosed embodiments.

As shown in FIG. 9, at the beginning of the fabrication process, a semiconductor substrate having a test region, isolation regions on both sides of the test region and core regions outside the isolation regions is provided (S01). FIG. 1 illustrates a cross-sectional view of a corresponding structure of the exemplary semiconductor device consistent with the disclosed embodiments.

As shown in FIG. 1, a semiconductor substrate 10 having a test region I, isolation regions II on both sides of the test region I and core regions III outside the isolation regions II may be provided.

The semiconductor substrate 100 may be made of silicon, germanium, silicon germanium, gallium arsenide or other suitable semiconductor material. The semiconductor substrate 100 may also be made of a composite structure such as silicon on insulator (SOI). Those skilled in the art can select the type of the semiconductor substrate 100 based on the semiconductor devices formed on the semiconductor substrate. Therefore the type of the semiconductor substrate should not limit the scope of the present invention. In one embodiment, the semiconductor substrate 100 is made of silicon.

The semiconductor substrate 100 may include a test region I, isolation regions II located on both sides of the test region I and core regions III located outside the isolation regions II. The test region I, the isolation regions II and the core regions III may also include spaces located above the semiconductor substrate 100. The test region I may be used to form test circuits and test points for testing the electrical performance of the devices within the chip. The test region I may also serve as scribe line of die cutting to separate the chips on the wafer.

The isolation regions II may be located on both sides of the test region I and between the core regions III and the test region I. The core regions III may be used to form devices on chips. The isolation regions II may be located in the periphery of the core regions III and serve as buffers to isolate the core regions III from the outside world.

When the device layer and other material layers are formed on the semiconductor substrate 100 to complete the chip fabrication, a die cutting process may be performed to cut along the test region I to separate the core regions III from each other on both sides of the test region I. The isolation regions located in the periphery of the core regions III may protect the core regions III and the devices located above the core regions III from being affected by the water vapor stress in the external environment and thus ensure the quality of the chips.

Figure 2:
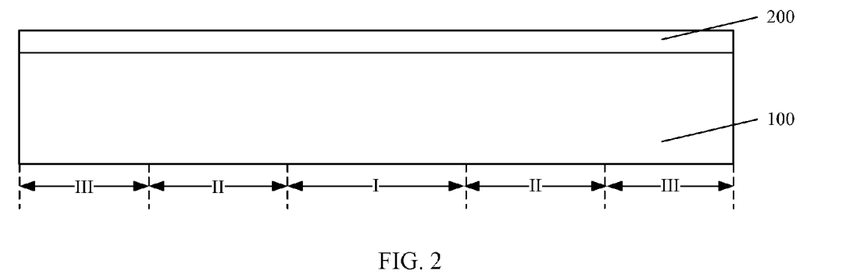

Returning to FIG. 9, a device layer is formed on the surface of the semiconductor substrate (S02). FIG. 2 illustrates a cross-sectional view of a corresponding structure of the exemplary semiconductor device consistent with the disclosed embodiments.

As shown in FIG. 2, a device layer 200 may be formed on the surface of the semiconductor substrate 100.

The device layer 200 may include devices located on the surface of the semiconductor substrate 100 and a first dielectric layer (not illustrated) may cover the devices. The devices may include transistors, capacitors, inductors and resistors, etc.

The first dielectric layer covering the devices may isolate the devices from subsequently formed material layers. The first dielectric layer may be made of silicon oxide. In other embodiments, the first dielectric layer may be made of a low K dielectric material or a porous carbon-silicon oxide such as silicon oxide to improve the barrier performance of the first dielectric layer and to reduce the RC delay of device operation.

Figure 3:
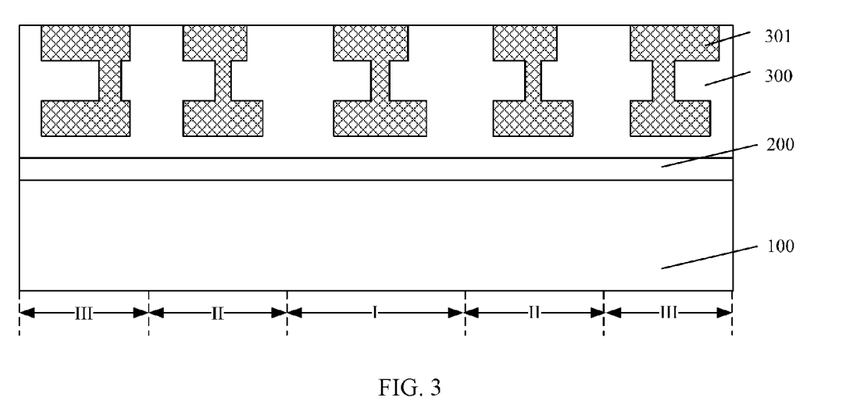

Returning to FIG. 9, an interconnect layer is formed on the surface of the device layer (S03). FIG. 3 illustrates a cross-sectional view of a corresponding structure of the exemplary semiconductor device consistent with the disclosed embodiments.

As shown in FIG. 3, an interconnect layer may be formed on the surface of the device layer 200.

The interconnect layer may include a second dielectric layer 300 and metal interconnect structures 301 inside the second dielectric layer 300.

The metal interconnect structures 301 may be used to connect the devices in the device layer 200 and to form a circuit structure. The metal interconnect structures 301 may include interconnect wires and metal vias to connect the interconnect wires in the upper and lower layers. In one embodiment, metal interconnect structures 301 are formed above the test region I, the isolation regions II and the core regions III. In one embodiment, the metal interconnect structures 301 may provide the electrical connections to the devices in the device layer 200 through metal vias (not shown).

The second dielectric layer 300 may function as a barrier layer and a support structure between the metal interconnect structures 301. The second dielectric layer 300 may be made of silicon oxide. In other embodiments, the second dielectric layer 300 may also be made of a silicon oxycarbide, a porous silicon oxide or any other low K dielectric material to improve the barrier performance of the second dielectric layer 300 and to reduce the RC delay of the metal interconnect structures 301.

During the formation process of the interconnect layer, after the second dielectric layer 300 is formed, through-holes and trenches may be formed in the second dielectric layer 300. The through-holes and trenches may be filled with metallic material to form the metal interconnect structures 301. The top surfaces of the metal interconnect structures 301 may be coplanar with the surface of the second dielectric layer 300. The second dielectric layer 300 may be a single layer or a multilayer structure.

Figure 4:
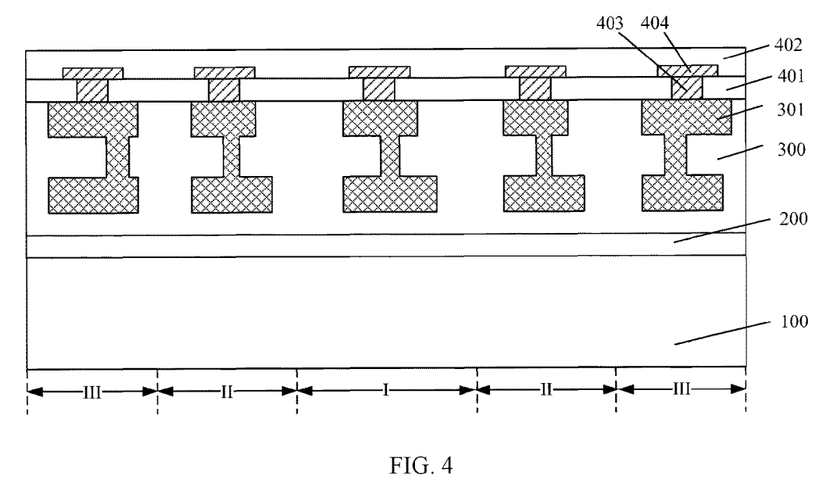

Returning to FIG. 9, a soldering pad layer is formed on the surface of the interconnect layer (S04). FIG. 4 illustrates a cross-sectional view of a corresponding structure of the exemplary semiconductor device consistent with the disclosed embodiments.

As shown in FIG. 4, a soldering pad layer may be formed on the surface of the interconnect layer.

The soldering pad layer include a plurality of soldering pads 404 located above the test region I, the isolation regions II and the core regions III and the passivation layer covering the surfaces of the soldering pads 404 and the interconnect layer.

The passivation layer may be made of one or more materials selected from silicon oxide, silicon nitride, silicon oxynitride, polyimide, epoxy resin, phenol resin and benzoxazine resin to protect the interconnection layer and the soldering pads. In one embodiment, the passivation layer is made of silicon oxide.

In one embodiment, the passivation layer may include a first passivation layer 401 located on the surface of the interconnect layer and a second passivation layer 402 located on the surface of the first passivation layer 401. The soldering pads 404 located above the test region I, the isolation regions II and the core regions III may be electrically connect to the metal interconnect structures 301 in each region respectively. In one embodiment, the soldering pads 404 are electrically connected to the metal interconnect structures 301 through metal vias 403.

Specifically, after the first passivation layer 401 is formed on the surface of the interconnect layer, through-holes may be formed in the passivation layer 401 exposing portion of the surfaces of the metal interconnect structures 301. Then the through-holes may be filled with metallic material to form metal vias 403. A metal layer may be formed on the surfaces of the first passivation layer 401 and the metal vias 403. The soldering pads 404 may be formed by patterning the metal layer. Then the second passivation layer 402 may be formed covering the first passivation layer 401 and the soldering pads 404.

The soldering pads 404 may be used to bond or form solder balls in the subsequent packaging process. The soldering pads 404 may be made of a metal such as copper or aluminum.

In one embodiment, the passivation layer may be subsequently etched to form trenches in the passivation layer exposing the surfaces of the soldering pads 404 located above the core regions III and the test region I. Using a dry etch process, the passivation layer, the interconnect layer and the device layer 200 may be sequentially etched to form isolation trenches at the junctions of the isolation regions II and the test region I to disconnect the passivation layer, the interconnect layer and the device layer.

Figure 5:
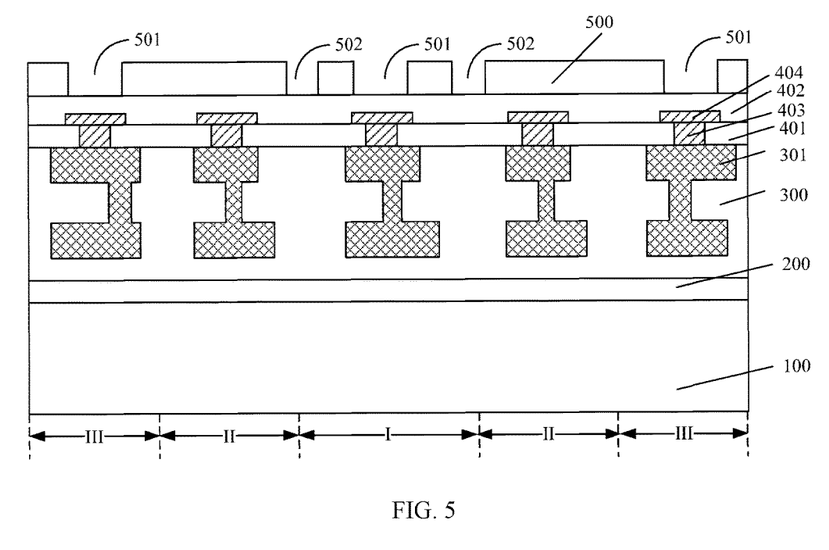
Figure 6:
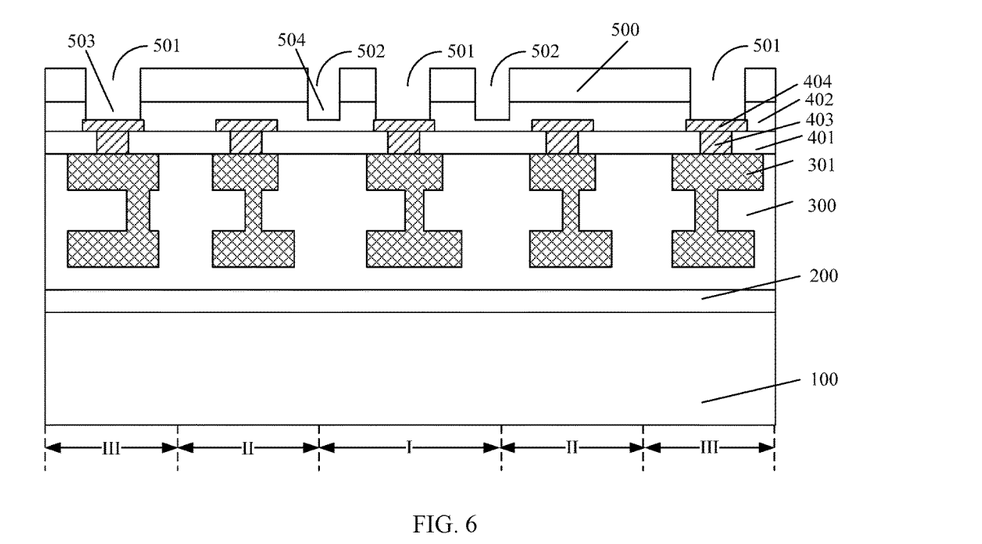

FIGS. 5-7 illustrate the cross-sectional views of a corresponding structure of one embodiment of forming the trenches and the isolation trenches.

Returning to FIG. 9, a mask layer is formed on the surface of the passivation layer exposing portion of the passivation layer on the surfaces of the soldering pads located above the core regions and the test region and portion of the passivation layer located at the junctions of the test region and the isolation regions (S05). FIG. 5 illustrates a cross-sectional view of a corresponding structure of the exemplary semiconductor device consistent with the disclosed embodiments.

As shown in FIG. 5, a mask layer 500 may be formed on the surface of the passivation layer exposing portion of the passivation layer on the surfaces of the soldering pads 404 located above the core regions III and the test region I and portion of the passivation layer located at the junctions of the test region I and the isolation regions II.

Specifically, in one embodiment, the mask layer 500 may be formed on the surface of the second passivation layer 402. The mask layer 500 may have first openings 501 and second openings 502. The first openings 501 may expose portion of the second passivation layer 402 on the surfaces of the soldering pads 404 located above the core regions III and the test region I. The second openings 502 may expose portion of the second passivation layer 402 at the junctions of test region I and the isolation regions II.

The mask layer 500 may be made of a photoresist. To form the mask layer 500, a spin-coating process is used to form a photoresist layer on the surface of the second passivation layer 402. The photoresist layer may be exposed and developed to form the mask layer 500 having first openings 501 and second openings 502.

The size and positions of the first openings 501 may correspond to the size and positions of the trenches subsequently formed on the surfaces of the soldering pads 404. The size and positions of the second openings 502 may correspond to the size and positions of the isolation trenches subsequently formed at the junctions of test region I and the isolation regions II.

The size of the first openings 501 may be slightly smaller than the size of the soldering pads 404 such that the subsequently formed trenches may completely locate on the surfaces of the soldering pads 404. Functioned primarily as a barrier, the isolation regions may not contribute the chip circuits. In one embodiment, the mask layer 500 may be used to form first openings above the test region I and the core regions III. The passivation layer may be subsequently etched to form trenches only on the surfaces of the soldering pads 404 located above the test region I and the core regions III.

Returning to FIG. 9, the mask layer is used as an etch mask to etch the passivation layer to form trenches on the surfaces of the soldering pads located above the core regions and the test region and trenches in the passivation layer located at the junctions of the test region and the isolation regions (S06). FIG. 6 illustrates a cross-sectional view of a corresponding structure of the exemplary semiconductor device consistent with the disclosed embodiments.

As shown in FIG. 6, the mask layer 500 is used as an etch mask to etch the passivation layer to form trenches on the surfaces of the soldering pads 404 located above the core regions III and the test region I and trenches in the passivation layer located at the junctions of the test region I and the isolation regions II.

In one embodiment, the mask layer 500 may be used as an etch mask to etch the second passivation layer 402 to the surfaces of the soldering pads 404 through the first openings 501 to form the trenches 503 on the surfaces of the soldering pads 404 located above the core regions III and the test region I. In the meantime, the second passivation layer 402 may be etched through the second openings 502 to form trenches 504 in the second passivation layer 402 at the junctions of the test region I and the isolation regions II. Both trenches 503 and trenches 504 may be formed simultaneously.

In one embodiment, the second passivation layer 402 may be made of silicon oxide. A dry etching process may be used to etch the second passivation layer 402. The etching gas used in the dry etching process may include one or more of $CF_4$, $CHF_3$, $C_2F_6$ and $C_3F_8$. The soldering pads 404 may serve as an etch stop layer.

The soldering pads may not be formed at the junctions of the test region I and the isolation region II such that bottoms of the trenches 504 may still be in the passivation layer.

Returning to FIG. 9, along the trenches in the passivation layer at the junctions of the test region and the isolation regions, the passivation layer, the interconnect layer and the device layer are etched to form isolation trenches at the junctions of the isolation regions and the test region (S07). FIG. 7 illustrates a cross-sectional view of a corresponding structure of the exemplary semiconductor device consistent with the disclosed embodiments.

As shown in FIG. 7, along the trenches 504 in the passivation layer at the junctions of the test region I and the isolation regions II, the passivation layer, the interconnect layer and the device layer 200 are etched to form isolation trenches 514 at the junctions of the isolation regions II and the test region I.

A dry etching process may be used to etch the passivation layer, the interconnect layer and the device layer 200. At the junctions of the test region I and the isolation regions II, the interconnect layer may only have a second dielectric layer 300 and the device layer 200 may only have a first dielectric layer. Thus, in one embodiment, a portion of each of the second passivation layer 402, the first passivation layer 401, the second dielectric layer 300 and the first dielectric layer under the bottom of the trenches 504 may be etched and removed to expose a surface portion of the semiconductor substrate 100 to form isolation trenches 514.

In one embodiment, a dry etching process may be used to etch the passivation layer, the interconnect layer and the device layer 200 to form the isolation trenches 514. The dry etching process may have a high etch selectivity to silicon oxide. Specifically, the dry etching process may include an etching gas containing one or more of $CF_4$, $CHF_3$, $C_2F_6$ and $C_3F_8$, a flow rate ranging approximately from 50 sccm to 1000 sccm, and a pressure ranging approximately from 20 mTorr to 200 mTorr.

In other embodiments, depending on materials of the passivation layer, the second dielectric layer and the first dielectric layer, different etching gas and etching parameters may be used accordingly in the etching process.

In the dry etching process, plasma may react with and vaporize the material layers to form the isolation trenches 514. In the etching process, no stress may be applied to the material layers to cause the de-lamination and cracking between the material layers.

In the etching process, the mask layer 500 (referring to FIG. 6) may protect the underneath passivation layer from the etching. After the isolation trenches 514 are formed, the mask layer 500 may be removed. Because the dry etching process has a very low etch rate to the soldering pads 404, the depth of the trenches 503 may not increase.

The isolation trenches 514 may disconnect and isolate portions of each of the passivation layer, the interconnect layer and the device layer located above the test region I and the isolation regions II. When the test region I is subsequently cut along, the cutting stress may not be transferred to the passivation layer, the interconnect layer and the device layer 200 located above the isolation regions II and the core regions III. Thus, de-lamination and cracking may not occur in the passivation layer, the interconnect layer and the device layer 200 located above the isolation regions II and the core regions III.

The sidewalls of the isolation trenches 514 may be vertical or inclined. The minimum width of the isolation trenches 514 may not be limited as long as the passivation layer, the interconnect layer and the device layer located above the test region I and the isolation regions II are isolated.

In one embodiment, the width of the isolation trenches 514 may be greater than 0.5 micrometers. In one aspect, such desirable width may allow formation of the second openings 502 in the mask layer 500 (referring to FIG. 6) with the same width to be less difficult. Due to the limitation of the lithographic resolution, a smaller width may make it difficult to form the second openings 502. In another aspect, such desirable width may make it less difficult to use the dry etching process to form the isolation trenches 514. When the width is too small, the concentration of the etching gas entering the isolation trenches 514 may gradually decrease as the etching depth increases. The etching process may not progress further into the isolation trenches 514 to completely disconnect the passivation layer, the interconnect layer and the device layer located above the test region I and the isolation regions II.

In other embodiments, after the device layer 200 is etched, a portion of the thickness of the semiconductor substrate 100 may be etched to make the bottom of the isolation trenches 514 located inside the semiconductor substrate 100. Due to the presence of the isolation trenches 514, when the test region I is subsequently cut, the cutting stress may only transfer through the connected material layer located at the bottom of the isolation trenches 514.

In other embodiments, the bottom of the isolation trenches 514 may be located inside the semiconductor substrate 100. Thus, the cutting stress may not be transferred between the semiconductor substrate 100 located on both sides of the isolation trenches 514. When semiconductor devices are subsequently formed in the semiconductor substrate 100, stress may not be transferred to the semiconductor devices already formed in the semiconductor substrate 100.

Usually semiconductor devices are formed near the surface area of the semiconductor substrate 100. In one embodiment, the depth of the isolation trenches 514 protruding into the semiconductor substrate 100 is greater than 5 micrometers to ensure that the depth of the devices formed in the semiconductor substrate 100 is less than the depth of the isolation trenches 514 protruding into the semiconductor substrate 100. Thus, the subsequent cutting process may not affect the devices in the semiconductor substrate 100.

In the meantime, in order to avoid affecting the soldering pads 404 and the metal interconnect structures 301 located above the test region I and the isolation regions II during the process of forming the isolation trenches 514, the minimum distance between the sidewalls of the isolation trenches 514 and the soldering pads 404 or the metal interconnect structures 301 located above isolation regions II must be greater than 0. In one embodiment, the minimum distance between the sidewalls of the isolation trenches 514 and the soldering pads 404 or the metal interconnect structures 301 located above isolation regions II is greater than 5 micrometers. The minimum distance between the sidewalls of the isolation trenches 514 and the soldering pads 404 or the metal interconnect structures 301 located above the isolation regions II must be greater than 0. In one embodiment, the minimum distance between the sidewalls of the isolation trenches 514 and the soldering pads 404 or the metal interconnect structures 301 located above the isolation regions II is greater than 5 micrometers.

In other embodiments, after the isolation trenches 514 are formed, a cleaning treatment may be performed to remove residuals remained in the isolation trenches 514.

In one embodiment, the mask layer 500 may simultaneously define the size and positions of the trenches 503 and the isolation trenches 514 and may be the mask layer to etch and form the trenches 503 and the isolation trenches 514, as shown in FIG. 7. No additional mask layer needs to be formed. Thus, the process is simplified.

In other embodiments, separate mask layers may be used to form the trenches 503 and the isolation trenches 514 respectively.

In one embodiment, to form the trenches 503 and the isolation trenches 514, a first mask layer may be formed on the surface of the passivation layer exposing portions of the passivation layer on the surfaces of the soldering pads 404 located above the core regions III and the test region I. The first mask layer may be used as an etch mask to etch the passivation layer to form the trenches 503 on the surfaces of the soldering pads 404 located above the core regions III and the test region I. The first mask layer may be removed to form a second mask layer in the trenches 503 and on the surface of the passivation layer exposing portion of the surface of the passivation layer at the junctions of the test region I and the isolation regions II. The second mask layer may be used as an etch mask to etch the passivation layer, the interconnect layer and the device layer to the semiconductor substrate 100 to form the isolation trenches 514 at the junctions of the isolation regions II and the test region I. After the isolation trenches 514 are formed, the second mask layer may be removed.

The first mask layer and the second layer may be made of a photoresist.

During the process of forming the isolation trenches 514, the second mask layer may cover the surfaces of the soldering pads 404 to avoid prolonged exposure of the soldering pads 404 to the plasma atmosphere, that may result in rough and/or damaged surfaces of the soldering pads 404 and may affect the connection quality of bonding and forming soldering balls on the surfaces of the soldering pads 404 in the subsequent packaging process.

In other embodiments, after the trenches 503 are formed, the soldering pads 404 located above the test region I may be used as test points to perform an electrical test. After the electrical test is completed, the isolation trenches 514 may then be formed.

Returning to FIG. 9, the test region between the adjacent isolation trenches is cut to disconnect the semiconductor substrate, the device layer, the interconnect layer and the soldering pad layer on both sides of the test region from each other (S08). FIG. 8 illustrates a cross-sectional view of a corresponding structure of the exemplary semiconductor device consistent with the disclosed embodiments.

As shown in FIG. 8, the test region I between the adjacent isolation trenches 514 is cut to disconnect the semiconductor substrate 100, the device layer 200, the interconnect layer and the soldering pad layer on both sides of the test region I.

A cutting blade may be used to cut the test region I to disconnect the semiconductor substrate 100, the device layer 200, the interconnect layer and the soldering pad layer at the test region I.

Prior to the cutting, the isolation trenches 514 may be formed between the test region I and the isolation regions II. During the process of cutting the test region I, the mechanical stresses generated during the cutting may only be contained in the test region I and may not be transferred to the isolation regions II and the core regions III. Thus, after the cutting is completed, the de-lamination and/or cracking may not occur between the various material layers located above the isolation regions II and the core regions III.

In one embodiment, the rate of the cutting blade ranges approximately from 20 mm/s to 50 mm/s. When the conventional method of direct blade cutting is used, the above-described cutting rate may cause a very low passing rate of the cut chips. In this embodiment, due to the presence of the isolation trenches 514, the cutting rate ranging approximately from 20 mm/s to 50 mm/s may still be able to maintain a high passing rate of the cut chips. In other embodiments, the cutting rate may be increased properly to improve the efficiency.

As such, a semiconductor substrate is provided having a test region, isolation regions located on both sides of the test region, and core regions located outside the isolation regions. A device layer, an interconnect layer on the device layer and a soldering pad layer on the interconnect layer are formed on the surface of the semiconductor substrate. The soldering pad layer includes a plurality of soldering pads located above the test region, the isolation regions and the core regions, and a passivation layer covering the surfaces of the soldering pads and the interconnect layer. The passivation layer is etched to form trenches exposing the surfaces of the soldering pads located above the core regions and the test region. The passivation layer, the interconnect layer and the device layer are sequentially etched to the surface of the semiconductor substrate to form isolation trenches at the junctions of the isolation regions and the test region to disconnect the passivation layer, the interconnect layer and the device layer. By cutting along the test region, the semiconductor substrate, the device layer, the interconnect layer and the soldering pad layer are separated from each other on both sides of the test region. The die cutting method improves the passing rate of the cut chips.

Although the present invention is disclosed above with various embodiments, the present invention is not limited thereto. Anyone skilled in the art may make various changes and modifications without departing from the spirit and scope of the present invention. Therefore the scope of the present invention should be defined by the claims thereof.

What is claimed is:

1. A die cutting method, comprising:
   providing a semiconductor substrate having a test region, isolation regions on both sides of the test region, and core regions outside of the isolation regions,
   wherein a device layer, an interconnect layer located on the device layer, and a soldering pad layer on the interconnect layer are formed on the semiconductor substrate, the soldering pad layer includes a plurality of soldering pads formed over the test regions, the isolation regions and the core regions, and a passivation layer covers the soldering pads and the interconnect layer;
   etching the passivation layer to form trenches exposing the soldering pads located above the core regions and the test region;
   etching the passivation layer, the interconnect layer, and the device layer to expose a surface of the semiconductor substrate to form isolation trenches at junctions of the isolation region and the test region, disconnecting the passivation layer, the interconnect layer and the device layer; and
   performing a cutting process along the test region between the adjacent isolation trenches, wherein each of the semiconductor substrate, the device layer, the interconnect layer and the soldering pad layer is cut in two.

2. The method according to claim 1, wherein the step for forming the trenches and the isolation trenches includes:
   forming a mask layer on the passivation layer to expose portions of the passivation layer corresponding to the soldering pads located above the core regions and the test region, and to expose portions of the passivation layer located at the junctions of the test region and the isolation region; and
   using the mask layer as an etch mask to etch the passivation layer to form trenches on surfaces of the soldering pads located above the core regions and the test region, and to form trenches located in the passivation layer at the junctions of the test region and the isolation region.

3. The method according to claim 1, wherein the width of the isolation trenches is greater than 0.5 micrometer.

4. The method according to claim 2, further including:
etching the trenches at the junctions of the test region and the isolation region to expose the surface of the semiconductor substrate to form the isolation trenches.

5. The method according to claim 4, further including:
after etching the device layer, continuing to etch a thickness of the semiconductor substrate such that the isolation trenches have a bottom located inside the semiconductor substrate.

6. The method according to claim 4, wherein a depth of the isolation trenches going into the semiconductor substrate is greater than 5 micrometers.

7. The method according to claim 1, further including:
after forming the isolation trenches, performing a cleaning treatment to remove residuals remained in the isolation trenches.

8. The method according to claim 1, wherein:
a minimum distance between adjacent sidewalls of the isolation trench and the soldering pad located above the isolation region or between adjacent sidewalls of the isolation trench and a metal interconnect structure in the interconnect layer is greater than 0.

9. The method according to claim 1, wherein:
a minimum distance between adjacent sidewalls of the isolation trench and the soldering pad located above the isolation region or between adjacent sidewalls of the isolation trench and a metal interconnect structure in the interconnect layer is greater than 5 micrometers.

10. The method according to claim 1, wherein:
a minimum distance between adjacent sidewalls of the isolation trench and the soldering pad located above the test region or between adjacent sidewalls of the isolation trench and a metal interconnect structure in the interconnect layer is greater than 0.

11. The method according to claim 1, wherein:
a minimum distance between adjacent sidewalls of the isolation trench and the soldering pad located above the test region or between adjacent sidewalls of the isolation trench and a metal interconnect structure in the interconnect layer is greater than 5 micrometers.

12. The method according to claim 1, wherein:
a cutting blade is used to cut along the test region at a rate ranging approximately from 20 mm/s to 50 mm/s.

13. The method according to claim 1, wherein the step for forming the trenches and the isolation trenches includes:
forming a first mask layer on the passivation layer exposing portions of the passivation layer on the soldering pads located above the core regions and the test region;
using the first mask layer as an etch mask to etch the passivation layer to form trenches in the passivation layer on the surfaces of the soldering pads located above the core regions and the test region;
removing the first mask layer and forming a second mask layer in the trenches and on a surface of the passivation layer to expose a portion of the passivation layer located at the junction of the test region and the isolation region; and
using the second mask layer as an etch mask to etch the passivation layer, the interconnect layer and the device layer to form the isolation trenches at the junction of the isolation region and the test region.

14. The method according to claim 1, wherein the passivation layer is made of one or more materials selected from silicon oxide, silicon nitride, silicon oxynitride, polyimide, epoxy resin, phenol resin, and benzoxazine resin.

15. The method according to claim 1, wherein the device layer includes devices located on the semiconductor substrate and a first dielectric layer covering the devices.

16. The method according to claim 1, wherein the interconnect layer includes a second dielectric layer and metal interconnect structures located in the second dielectric layer, and wherein the soldering pads are electrically connected to the metal interconnect structures.

17. The method according to claim 1, wherein a dry etching process is used to etch the passivation layer, the interconnect layer and the device layer to form the isolation trenches, using an etching gas containing one or more of $CF_4$, $CHF_3$, $C_2F_6$ and $C_3F_8$, a flow rate ranging approximately from 50 sccm to 1000 sccm, and a pressure ranging approximately from 20 mTorr to 200 mTorr.

18. A semiconductor die, comprising:
a cut semiconductor substrate having a cut test region, a core region, and an isolation region configured between the cut test region and the core region;
a cut device layer on the cut semiconductor substrate;
a cut interconnect layer on the cut device layer;
a cut soldering pad layer on the cut interconnect layer;
a passivation layer on the cut soldering pad layer, wherein;
the cut soldering layer includes a cut soldering pad over the cut test region, and a plurality of soldering pads over the isolation region and the core region, the cut soldering pad having a width less than each soldering pad,
the passivation layer includes trenches exposing the cut soldering pad over the cut test region and exposing a soldering pad above the core region, and
an isolation trench is formed through the passivation layer, the cut interconnect layer, and the cut device layer to expose a surface of the cut semiconductor substrate at a junction between the isolation region and the cut test region.

19. The semiconductor die according to claim 18, wherein each of the cut device layer and the cut interconnect layer is made of a material selected from silicon oxide, silicon oxycarbide, porous silicon oxide, and a combination thereof.

20. The semiconductor die according to claim 18, wherein the isolation trench at the junction of the isolation region and the test region has a bottom going into the semiconductor substrate for greater than 5 micrometers.

\* \* \* \* \*